United States Patent
Laubhan

(10) Patent No.: US 6,182,269 B1
(45) Date of Patent: *Jan. 30, 2001

(54) METHOD AND DEVICE FOR FAST AND ACCURATE PARASITIC EXTRACTION

(75) Inventor: Richard A. Laubhan, Fort Collins, CO (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/907,183

(22) Filed: Aug. 6, 1997

(51) Int. Cl.[7] .................................................. G06F 17/50
(52) U.S. Cl. ..................................... 716/5; 716/6; 716/12
(58) Field of Search ...................... 395/500.06, 500.07, 395/500.13; 716/12, 5, 6

(56) References Cited

U.S. PATENT DOCUMENTS

| | | | |
|---|---|---|---|
| 5,295,088 | 3/1994 | Hartoog et al. | 364/578 |
| 5,446,674 | 8/1995 | Ikeda et al. | 364/489 |
| 5,452,224 | 9/1995 | Smith, Jr. et al. | 364/488 |
| 5,469,366 | 11/1995 | Yang et al. | 364/489 |
| 5,596,506 | 1/1997 | Petschauer | 364/491 |
| 5,831,870 | * 11/1998 | Folta et al. | 716/5 |
| 5,896,300 | * 4/1999 | Raghavan et al. | 395/500.11 |

* cited by examiner

Primary Examiner—Kevin J. Teska
Assistant Examiner—Hugh Jones

(57) ABSTRACT

A method designates nets of a circuit for detailed parasitic impedance extraction (e.g., calculation of parasitic resistance and/or capacitance components of circuit interconnects) by comparing an estimated net impedance parameter with other circuit characteristics, such as the output resistance of a driver cell or the gate capacitance provided by load elements connected to the net. One or more threshold percentage parameters may be used in the comparison. Also, based on the designation, the estimated net impedance parameter or the detailed parasitic impedance value may be used for calculating logic delay through a logic cell driving the net. A program stored on a computer readable medium also operates to evaluate the parasitic impedance of circuit interconnects relative to other circuit characteristics and, depending on this evaluation, calculates the logic delay of a logic cell driving the net using an estimated net impedance parameter or detailed parasitic impedance parameter.

1 Claim, 6 Drawing Sheets

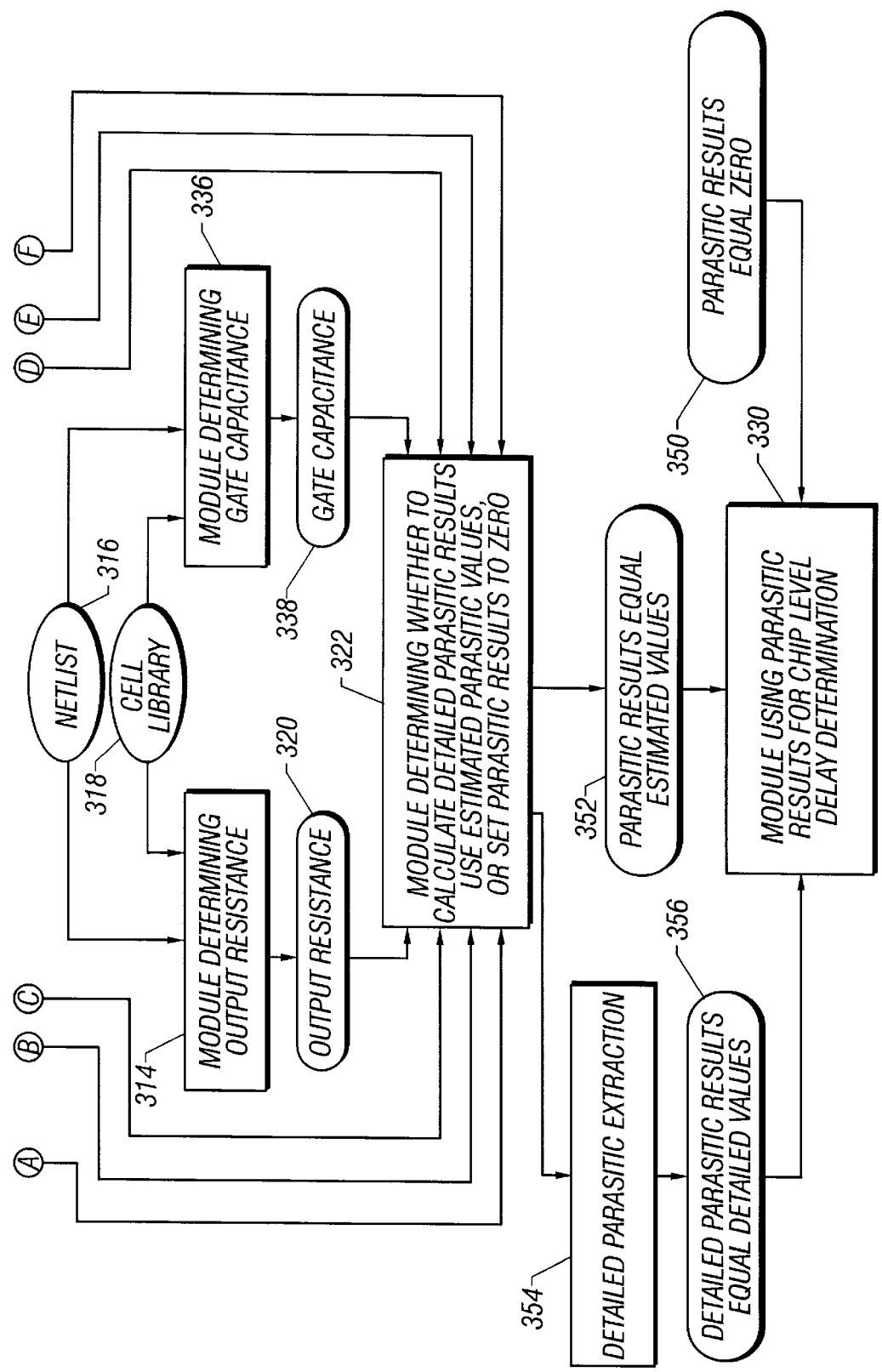

METHOD AND DEVICE FOR FAST AND ACCURATE PARASITIC EXTRACTION

FIELD OF THE INVENTION

The present invention pertains generally to computer-aided design methods and systems and more particularly to circuit analysis devices.

BACKGROUND OF THE INVENTION

When using a computer-aided design system to design microelectronic devices, a designer typically generates a behavioral description using a high-level description language or a circuit level description using a schematic capture tool. Thereafter, the designer can incrementally simulate and verify the design using logic level models incorporating accurate timing and delay information. At this stage, the design is represented as instances of logic cells having input and/or output ports. Furthermore, the circuit description includes structures called nets, which interconnect the ports on various logic cells. An active logic cell having at least one output port connected to the net is considered a driver cell. Tri-stated cells having at least one output port connected to the net or other cells having at least one input port connected to the net are considered load cells on the net.

When a designer simulates a circuit design, it is typically necessary to determine the logic delay associated with each driver cell. A logic delay is the period of time required for a signal transition at an input of a driver cell to be propagated to the output of the cell. For example, an input signal makes a transition from low to high, crossing a threshold voltage at time $t_0$. This input transition may cause the signal at an output of the driver cell to transition, crossing a voltage threshold at time $t_1$. The logic delay of the example cell is $(t_1-t_0)$.

Previous methods for determining logic delay through a logic cell are disclosed in W. C. Elmore, *The Transient Response of Damped Linear Networks with Particular Regard to Wide-Band Amplifiers*, 19 Journal of Applied Physics 55 (1948), and L. T. Pillage and R. A. Rohrer, *Asymptotic Waveform Analysis for Timing Analysis*, CAD-6 IEEE Transactions on Computer Aided Design for Integrated Circuits, 352 (1990), which are herein incorporated by reference.

The total logic delay for each cell may be considered to be the sum of gate delay and interconnect delay components. The gate delay is influenced by many characteristics of the circuit, including the internal characteristics of the driver cell, the rise and fall times of the input signal, and the load capacitance presented by load cells connected to the net. The interconnect delay is influenced by the parasitic net impedance provided by the metal interconnect lines between the output port of the driver cell and the ports of the load cells. The net impedance may be considered to have two components: parasitic resistance and parasitic capacitance.

Before the circuit layout is performed, the actual interconnect lengths between circuit elements are not known. Therefore, estimates of parasitic resistance and capacitance may be used for logic delay calculations in the circuit. After layout, however, the actual physical layout (length) of each net is known, and a variety of improved approximations of interconnect resistance and capacitance (RC), obtained by parasitic RC extraction, may be employed in logic delay calculations. As device and interconnect geometries decrease, the influence of interconnect impedance on total logic delay increases. Therefore, the delay attributed to interconnect impedance may rival or exceed the delay attributed to the transistor behavior of the driver cell and the effect of the load capacitances presented by load cells on the net. The impact of interconnect delay is so significant that a dominance of interconnect delay over gate delay in deep submicron IC technology is widely asserted in the academic and electronic design automation (EDA) industry press. Accordingly, improvements in parasitic RC extraction can provide more accurate design simulations by improving overall logic delay accuracy.

Fast methods of parasitic impedance extraction are available from leading EDA vendors. For example, a Detailed Standard Parasitic Format (DSPF) file for a 240,000 gate design can be extracted in 14 minutes on a SPARC20 workstation using the AQUARIUS router from AVANT! CORPORATION. This fast method, however, uses simple resistance and capacitance models wherein the parasitic resistance and capacitance for each metal layer is assumed to be a constant value per unit length.

The actual capacitance effects of a length of interconnect are not constant per unit length, varying with metal line width, dielectric thickness and other fabrication and design characteristics. Therefore, the simple extraction method produces inaccurate results for a subset of nets within a design. Particularly, the complexity of multiple interconnect layers, combined with the proximity effects due to very narrow metal spacing, can induce an error of up to 50% using the simple capacitance model. Likewise, actual interconnect resistance is not constant per unit length, varying with sheet resistance and line width. Nevertheless, the simple models are accurate for a majority of nets in a design.

Modern EDA vendors also offer advanced parasitic RC extraction software that is more accurate than the simple RC model but which require significantly longer central processor unit (CPU) run times. For example, the STAR-R software from AVANT! CORPORATION uses a 4-step extraction process. First, a capacitance-only (C-only) extraction is performed on every net in the design. Second, only resistance is extracted on every net (R-only). Third, delay calculations are performed to compare the R-only delay to the C-only delay. The delay calculations consume a significant amount of CPU time. On a net-by-net basis, if the difference between the R-only delay and the C-only delay exceeds a certain error criteria, the net is identified for detailed parasitic RC extraction. Fourth, detailed extraction is performed on the identified nets using a distributed impedance model to address the complexity of the narrow metal spacing and other deep submicron effects.

This detailed parasitic RC extraction process incurs long CPU run times, resulting in unacceptably long layout cycle times. For the same 240,000 gate design mentioned above, the CPU run time required for STAR-R on a SPARC20 is several hours. It is desirable to minimize the CPU run time required for parasitic RC extraction while maintaining acceptable accuracy of parasitic results. CPU run time can be improved by using the highest performance CPU platform available, but the growth rate of IC design complexity is keeping pace with increases in CPU clock rates. In addition, the cost of capital to purchase or lease the highest performance engineering workstations is extremely high. Furthermore, more accurate and more complex parasitic resistance and capacitance models may be employed to increase the accuracy of detailed parasitic extraction, but these models also increase the required CPU run time.

Therefore, there exists a need to select nets for which the simple parasitic model is accurate, to select the interconnect nets for which a more detailed parasitic extraction is required, and to select nets where parasitic interconnect effects are negligible. Furthermore, this method of selection must minimize CPU run time requirements so as not to contribute significantly to the CPU run time requirements of the overall parasitic RC extraction process. Accordingly, there exists a need to alleviate CPU intensive steps, such as the R-only and C-only delay calculations implemented in the STAR-R system, to achieve fast and accurate parasitic RC results.

SUMMARY OF THE INVENTION

It is therefore an object of the present invention to provide a technique for selecting the nets in a circuit for which a detailed parasitic RC extraction is required for acceptable accuracy.

It is another object of the present invention to provide a technique for selecting the nets in a circuit for which parasitic RC effect are negligible and may be ignored.

It is another object of the present invention to implement such selections of parasitic resistance and capacitance to other available circuit characteristics, so as to minimize the CPU run time requirements of the parasitic extraction process.

It is another object of the present invention to provide a technique for accurately extracting parasitic resistance and capacitance from a net and applying the resulting resistance and capacitance to determine a logic delay through a logic cell.

It is another object of the present invention to provide a system for extracting parasitic resistance and capacitance from a circuit design representation employing device characteristics of the cell library, and circuit characteristics of the design, and material characteristics of the fabrication technology.

Additional objects, advantages, and novel features of the invention will be set forth in part in the description which follows and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects, and in accordance with the purposes of the present invention, as embodied and broadly described herein, the method of this invention may comprise the steps of determining an estimated impedance parameter of the net; determining a cell impedance parameter associated with the net; designating the net for a detailed parasitic impedance extraction, if the estimated net impedance parameter exceeds a threshold percentage of the cell impedance parameter; and setting the parasitic impedance parameter equal to the estimated net impedance parameter, if the estimated net impedance parameter does not exceed the first threshold percentage of the cell impedance parameter.

The present invention may also comprise, in accordance with its object and purposes, a computer-readable medium device that stores a computer-executable program for extracting a parasitic impedance parameter associated with a net comprising a first program code portion that calculates an estimated net impedance parameter associated with the net; a second program code portion that calculates a cell impedance parameter associated with the net; and a third program code portion that designates the net for detailed parasitic impedance extraction, if the estimated net impedance parameter exceeds a threshold percentage of the cell impedance parameter.

BRIEF DESCRIPTION OF THE DRAWINGS

FIGS. 3A and 3B are an architectural diagram of a device for extracting parasitic resistance and capacitance associated with a net employing a plurality of thresholds for each impedance component.

DETAILED DESCRIPTION OF THE INVENTION

Figure 1A:
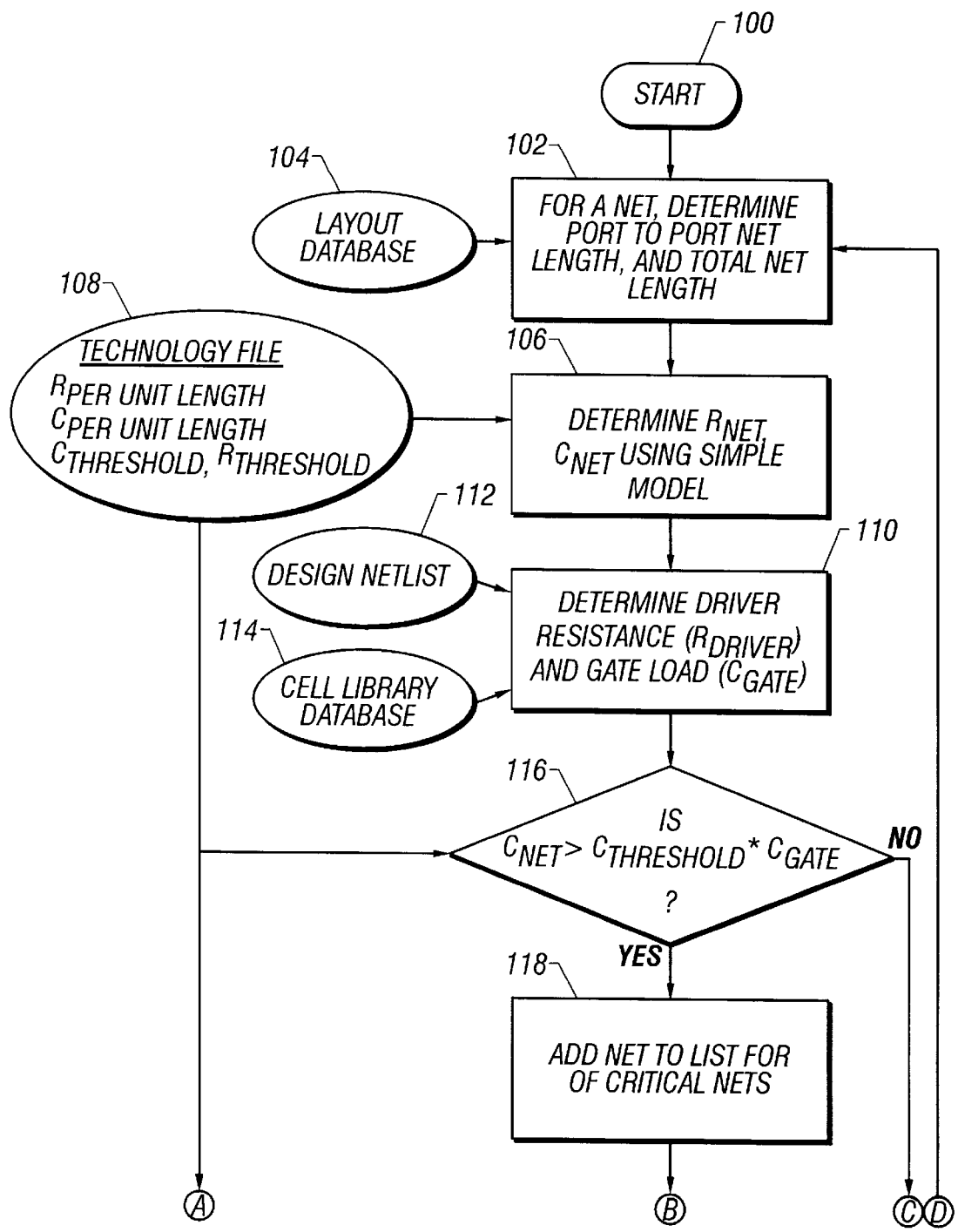
FIGS. 1A and 1B are a flow chart depicting a method for extracting parasitic resistance and capacitance from a net.

Referring now to FIG. 1A, showing a flow chart of a preferred embodiment of the invention, the process begins at block 100, which may be initiated by another program or module. Block 102 selects a net and determines a port-to-port net length and a total net length from layout database 104. The port-to-port net length, that is, the net length from the output port of the driver cell to the input port of the load cell, is required to evaluate net resistance. Block 106 determines the estimated net resistance ($R_{net}$) of the net by multiplying the port-to-port net length with a resistance per unit length value ($R_{per\ unit\ length}$) obtained from technology file 108. The $R_{per\ unit\ length}$ may be a constant value to simplify the estimation calculation. Furthermore, the $R_{per\ unit\ length}$ value may be associated with the net or with a subset of nets based on known characteristics, such as the number of vias or metals layers.

Likewise, block 106 also determines an estimated net capacitance ($C_{net}$) of the net by multiplying the total net length with a capacitance per unit length value ($C_{per\ unit\ length}$) obtained from technology file 108. The total net length, that is, the sum of the net lengths from the output port of the driver cell to all fanout branches on the net, is required to evaluate net capacitance. The $C_{per\ unit\ length}$ may also be a constant value to simplify the estimation calculation. Furthermore, the $C_{per\ unit\ length}$ value may be associated with the net or with a subset of nets based on known characteristics, such as the number of vias or metals layers.

Block 110 determines the gate load capacitance ($C_{gate}$) of the net, which is the sum of the load capacitances of the load cells connected to the net. The load cells are identified from connectivity information in design netlist 112. The load capacitances are obtained from cell library database 114 and may include input capacitances of the load cells or output capacitances of tri-stated drivers on the net.

Also, block 110 accesses design netlist 112 and cell library database 114 to determine the output resistance ($R_{driver}$) of the driver cell connected to the net. The driver cell is identified by connectivity information in design netlist 112. Block 110 determines $R_{driver}$ from the large-signal output impedance ($R_{eff}$) of the driver cell, which is determined from a logic delay equation for the driving cell contained in cell library database 114. To determine the large-signal output impedance of the driver, the following equation may be employed:

$$R_{eff} = (T_d/(C_{gate} + C_{net})) \tag{1}$$

where $T_d$ is a logic delay through the driver cell with $R_{net}=0$ and with a capacitive load equaling ($C_{gate} + C_{net}$), $C_{gate}$ is the sum of load capacitances, and $C_{net}$ is the estimated net capacitance. This calculation is further disclosed in N. Weste and Kamran Eshraghian, *Principles of CMOS VLSI Design, A Systems Perspective*, (2d. ed.1992), which is herein incorporated by reference.

In block 116, a threshold capacitance percentage ($C_{threshold}$) is obtained from technology file 108 and multiplied with $C_{gate}$, a step represented by ($C_{threshold}*C_{gate}$). If $C_{net}$ is greater than ($C_{threshold}*C_{gate}$), then the net is added to the list of "critical nets" in block 118. In a preferred embodiment of the invention, a threshold capacitance percentage of 20% is used.

Figure 1B:
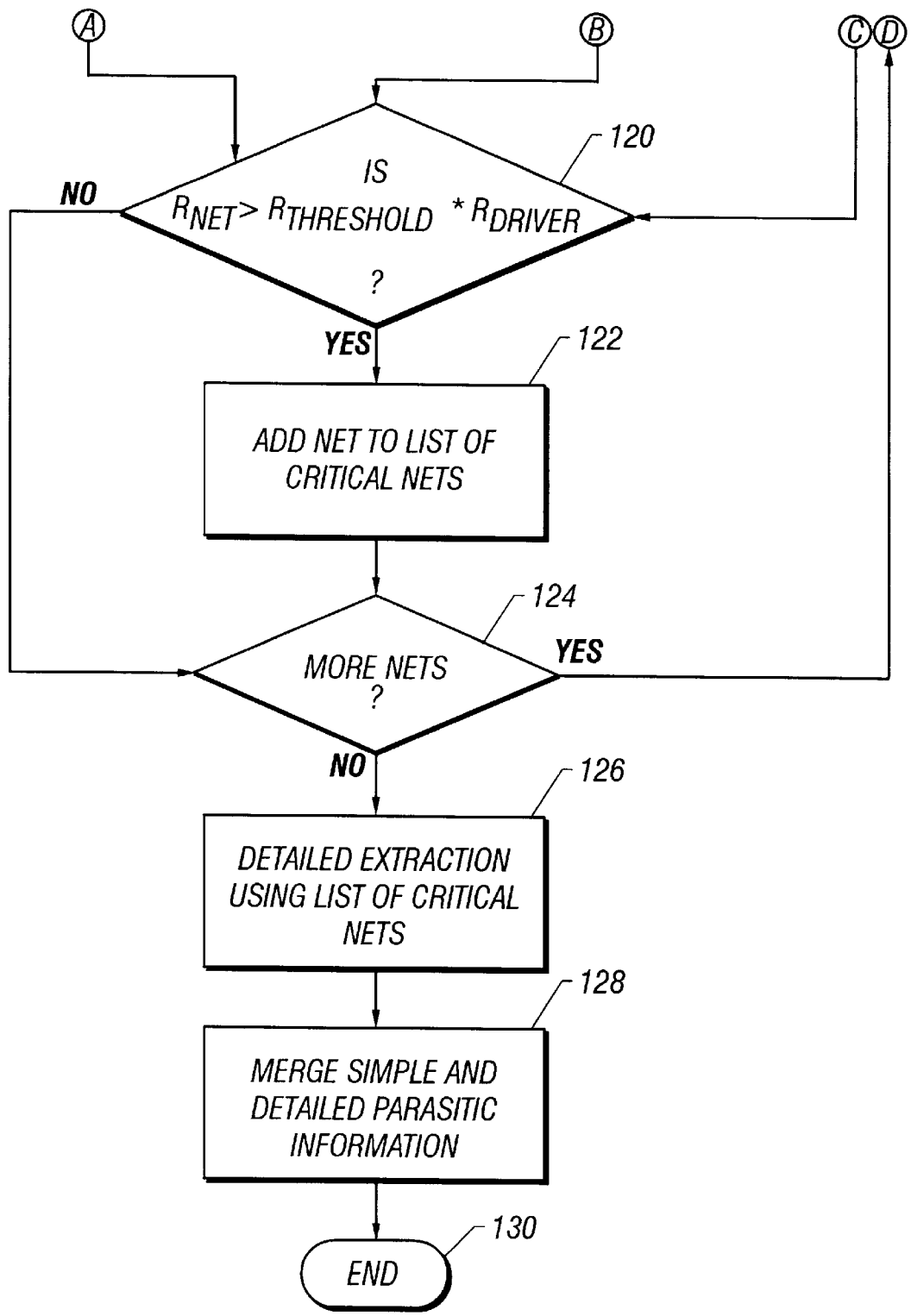

As shown in FIG. 1B, block 120 obtains a threshold resistance percentage ($R_{threshold}$) from technology file 108 and multiplies it with $R_{driver}$, a step represented by ($R_{threshold}*R_{driver}$). If $R_{net}$ is greater than ($R_{threshold}*R_{driver}$), then the net is added to a list of "critical nets" in block 122. In a preferred embodiment of the invention, a threshold resistance percentage of 20% is used.

In block 124, layout database 104 is tested to determined whether another net is available. If so, the process returns to block 102, repeating the process until all of the nets in layout database 104 have been processed.

Block 126 performs a detailed impedance extraction on each net in the list of "critical nets." The detailed impedance extraction employs a distributed impedance model. In a preferred embodiment, the STAR-R tool from AVANT! CORPORATION, employing a distributed impedance model, performs this function. In block 128, the detailed parasitic impedance values of critical nets are merged with the estimated net impedance values of noncritical nets ($R_{net}$ and $C_{net}$). The merged impedance data is then available for input into subsequent calculation steps, which may be executed after block 130.

In an embodiment of the invention, this process is extended to include a logic delay calculation, which determines the signal delay between input and output transition of a driver cell. In such an embodiment, the merged impedance data is input to the delay calculation step, which may perform logic delay calculations using both resistance and capacitance, or using only a single impedance component, either resistance or capacitance.

In the preferred embodiment, the FASNET tool from CADENCE DESIGN SYSTEMS, INC. is used to perform accurate delay calculations using extracted parasitic impedance results. FASNET uses a table-lookup technique to calculate logic delays. The tables, which may contain delay values corresponding to combinations of capacitive load and input slew rate, are associated with logic cells and are accessible by FASNET. Using the capacitive load value and an input slew rate value as inputs, FASNET can interpolate between known delay datapoints in the table to determine the delay resulting from the inputs. The input slew rate is the rise or fall time of the input signal to the driver cell. FASNET is also capable of determining logic delays including combined effects of parasitic resistance, parasitic capacitance, and input slew rate.

A logic delay is typically calculated for each input-port/output-port combination of each driver cell in the circuit design, and the logic delays are input to a circuit simulator, which calculates a simulated operational result of the circuit. The simulator employed in a preferred embodiment of the invention is the VERILOG simulator by CADENCE DESIGN SYSTEMS, INC. The simulated operational result may be compared to an expected operational result to verify the proper operation of the circuit design.

Referring generally to FIGS 1A and 1B, an additional embodiment of the invention may further include the steps of determining a second threshold resistance percentage ($R_{threshold2}$) (not shown) from technology file 108. In this embodiment, if $R_{net}$ is less than ($R_{threshold2}*R_{driver}$), then the parasitic resistance can be ignored. Likewise, an embodiment of the invention may further include the steps of determining a second threshold capacitance percentage ($C_{threshold2}$) (not shown) from technology file 108. In this embodiment, if $C_{net}$ is less than ($C_{threshold2}*C_{driver}$), then the parasitic net capacitance can be ignored.

Although FIGS. 1A and 1B depict a process in which both parasitic resistance and capacitance are evaluated and calculated, an embodiment of the invention may employ different combinations of estimated and detailed resistance and capacitance. For example, an embodiment of the invention may calculate a parasitic impedance parameter including either only resistance or only capacitance to determine whether a more detailed extraction is necessary. Furthermore, in an embodiment of the invention, the detailed impedance extraction can be limited to either only resistance or only capacitance.

Figure 2A:
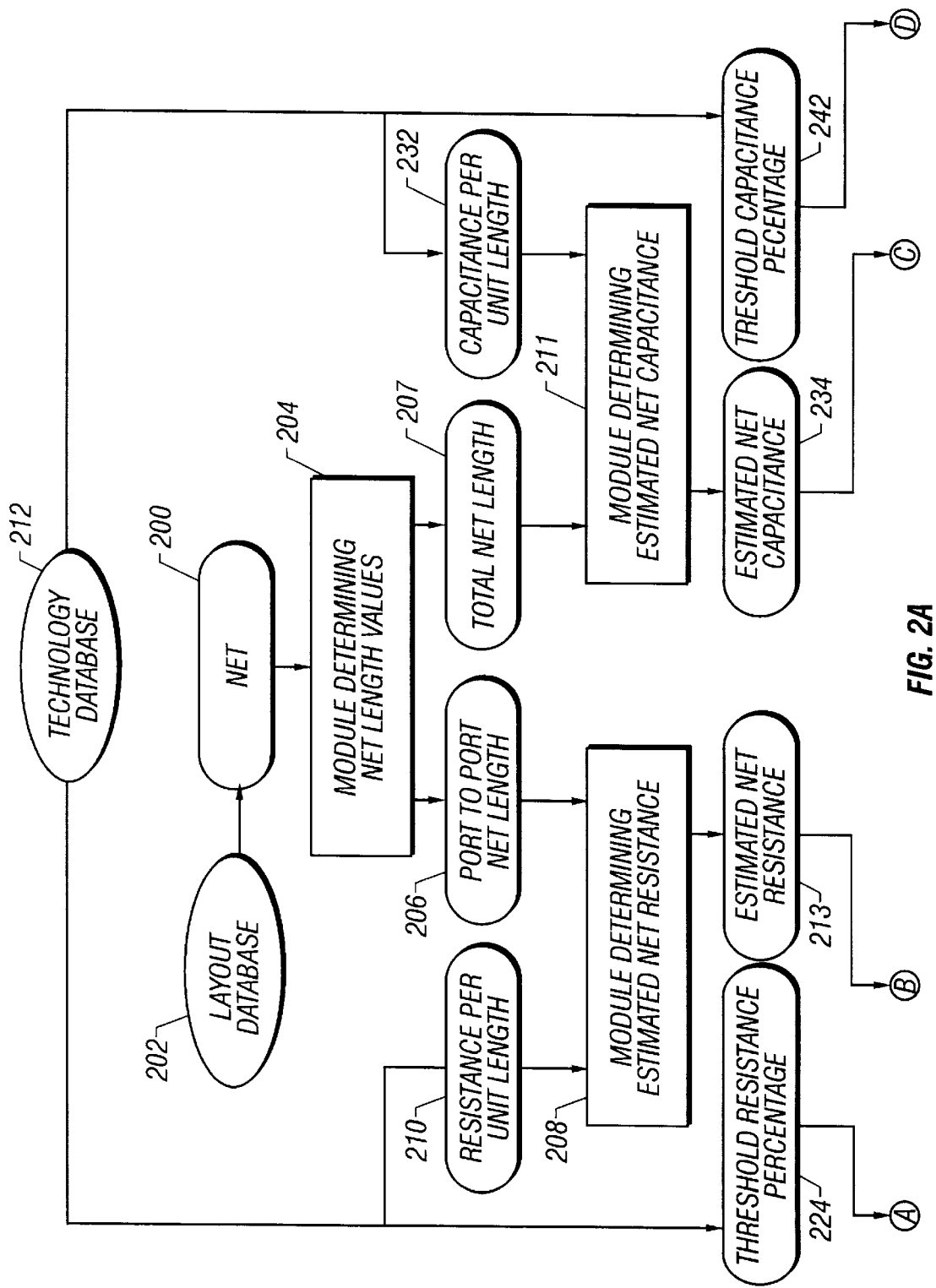
FIGS. 2A and 2B are an architectural diagram of a device for extracting parasitic resistance and capacitance associated with a net employing a single threshold for each impedance component.
Figure 2B:
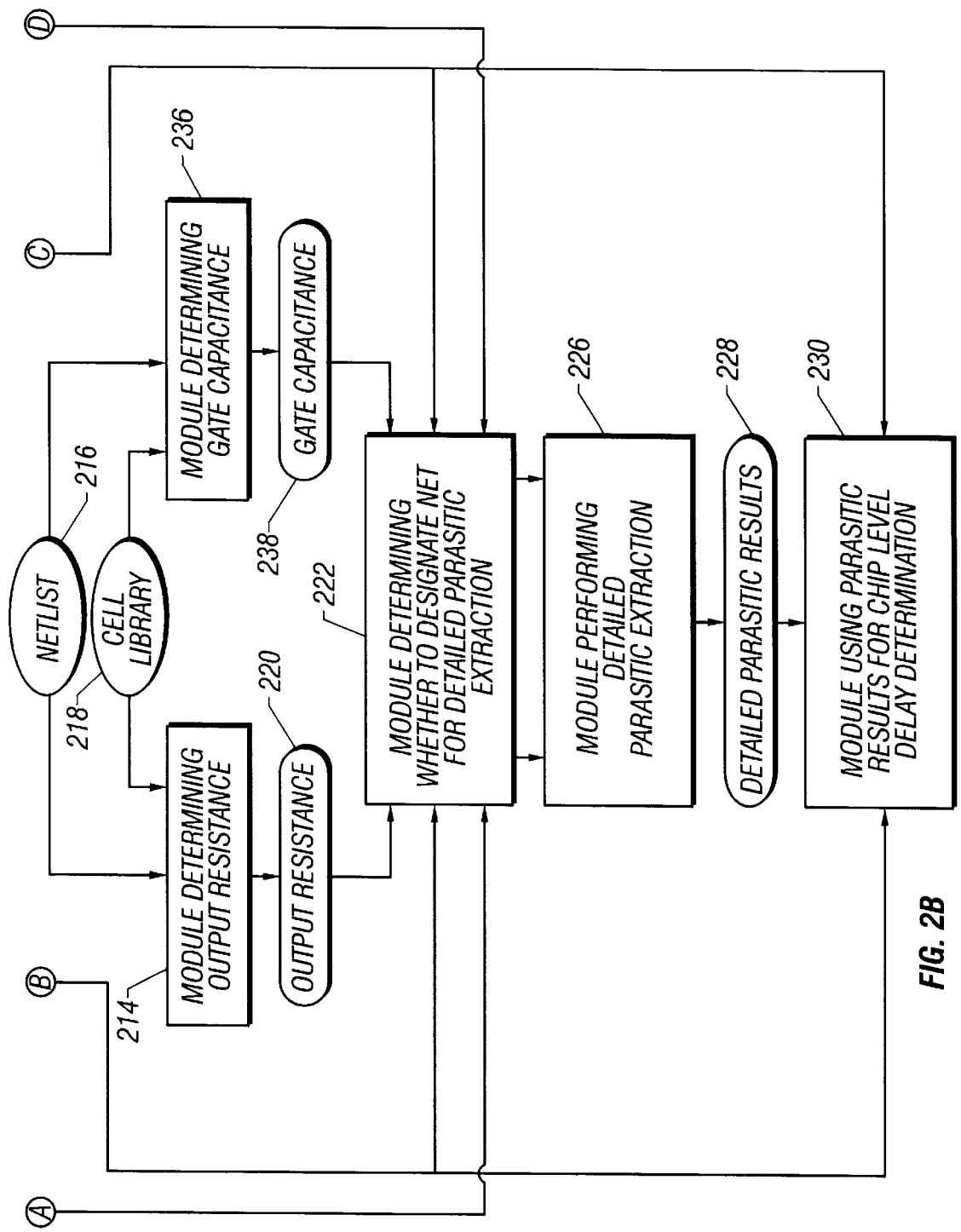

The architectural diagram in FIGS. 2A and 2B depicts a computer-executable program system for extracting a parasitic impedance for a net. In FIG. 2A, net 200 represents an interconnection between circuit elements derived from layout database 202. Module 204 receives net 200 as an input, determining and outputting port-to-port net length parameter 206 and total length parameter 207.

Port-to-port net length parameter 206 is received as input to module 208, which determines an estimated net resistance 213 of net 200. Module 208 also determines resistance per unit length value 210 from technology database 212. Resistance per unit length value 210 may be a constant value. Module 208 determines the estimated net resistance by multiplying resistance per unit length value 210 with port-to-port net length parameter 206 and outputs estimated net resistance parameter 213.

In FIG. 2B, module 214 obtains from netlist 216 the driving cell of net 200 and obtains from cell library 218 the large-signal output impedance of the driving cell. Module 214 also determines the output resistance of the driver cell from the large-signal output impedance of the driving cell, by setting output resistance parameter 220 equal to the large signal output impedance of the cell.

Module 222 receives output resistance parameter 220, multiplies it by threshold resistance percentage 224 obtained from technology database 212, and compares it to estimated net resistance parameter 213. If estimated net resistance parameter 213 is greater than the multiplicative product of threshold resistance percentage 224 and output resistance 220, then net 200 is designated for detailed parasitic extraction. In a preferred embodiment of the invention, threshold resistance percentage 224 equals 20%.

If net 200 is designated for detailed parasitic extraction, module 226 performs the extraction preferably employing a distributed impedance model. For example, this software may execute the STAR-R software from AVANT! CORPORATION to perform the detailed parasitic extraction using a distributed impedance model. The output of module 226, detailed parasitic results 228, may be input to module 230 for use in determining a chip delay of the driver cell of net 200. If module 222 does not designate net 200 for detailed parasitic extraction, estimated net resistance 213 is input to module 230 for chip level delay determination.

Likewise, returning to FIG. 2A, total net length parameter 207 is received as input to module 211, which determines an estimated net capacitance of net 200. Module 211 also determines capacitance per unit length value 232 from technology database 212. Capacitance per unit length value 232 may be a constant value. Module 211 determines the estimated net capacitance by multiplying capacitance per unit length value 232 with total net length 206 and outputs estimated net capacitance parameter 234.

In FIG. 2B, module 236 obtains from netlist 216 the load cells of net 200 and obtains from cell library 218 the load capacitances of each load cell. Module 236 also calculates a gate capacitance of net 200, which is the sum of load capacitances of the cells loading net 200. The sum of these load capacitances are output from module 236 as gate capacitance value 238, which is input to module 222.

Module 222 receives gate capacitance value 238, multiplies it by threshold capacitance percentage 242 obtained from technology database 212, and compares it to estimated net capacitance parameter 234. If estimated net capacitance parameter 234 is greater than the multiplicative product of threshold capacitance percentage 242 and gate capacitance 238, then net 200 is designated for detailed parasitic extraction. In a preferred embodiment of the invention, threshold capacitance percentage 242 equals 20%.

As with the parasitic resistance portion of the system, module 226 performs detailed parasitic extraction for nets designated for detailed parasitic extraction by module 222. If module 222 does not designate net 200 for detailed parasitic extraction, the estimated net capacitance 234 is input to module 230 for chip level delay calculation. Otherwise, the detailed parasitic results are input to module 230.

Figure 3A:
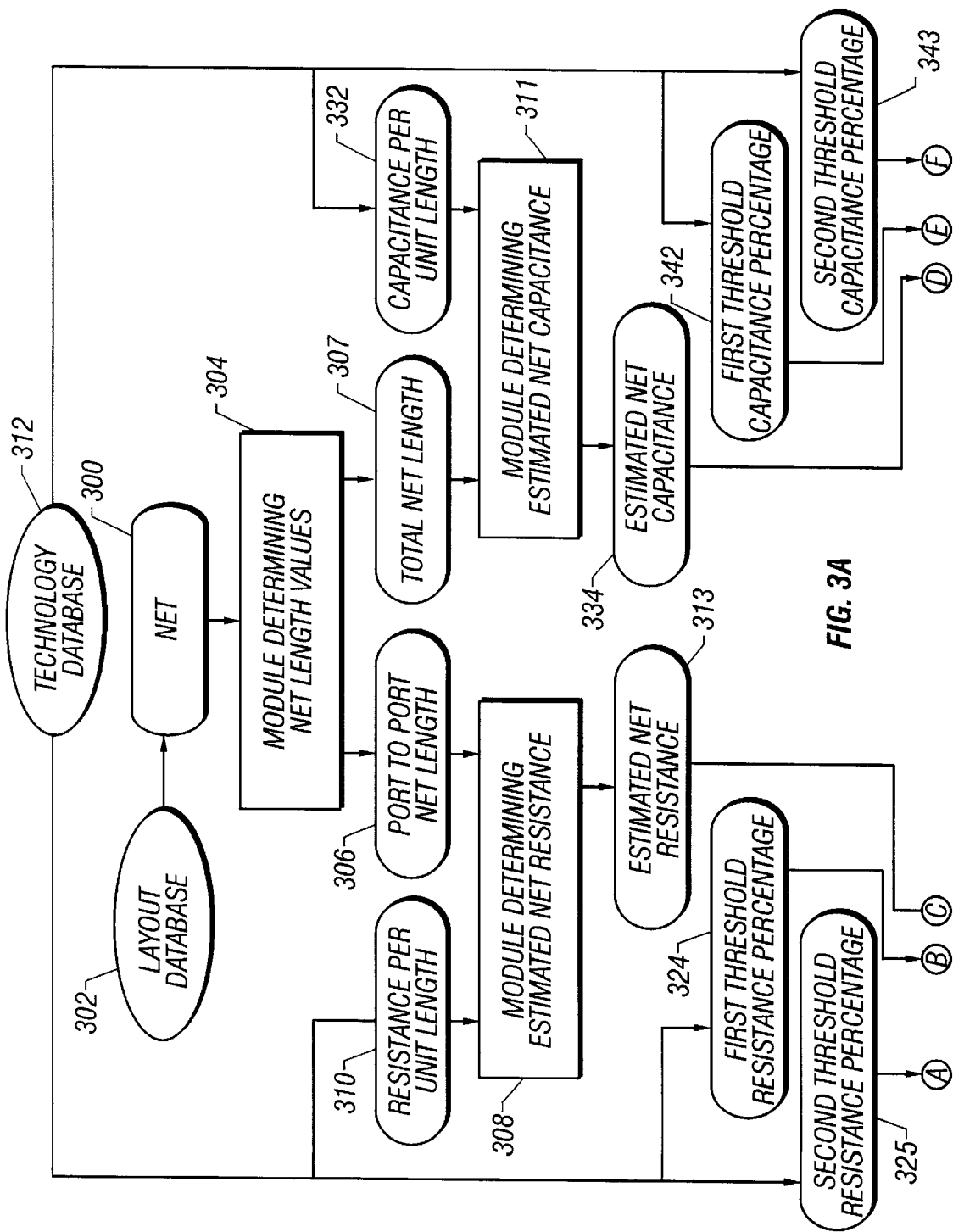

The architectural diagram in FIGS. 3A and 3B depicts a computer-executable program system for extracting a parasitic impedance for a net. In FIG. 3A, net 300 represents an interconnection between circuit elements derived from layout database 302. Module 304 receives net 300 as an input, determining and outputting port-to-port net length parameter 306 and total length parameter 307.

Port-to-port net length parameter 306 is received as input to module 308, which determines an estimated net resistance of net 300. Module 308 also determines resistance per unit length value 310 from technology database 312. Resistance per unit length value 310 maybe a constant value. Module 308 determines the estimated net resistance by multiplying resistance per unit length value 310 with port-to-port net length parameter 306 and outputs estimated net resistance parameter 313.

In FIG. 3B, module 314 obtains from netlist 316 the driving cell of net 300 and obtains from cell library 318 the large-signal output impedance of the driving cell. Module 314 also determines the output resistance of the driver cell from the large-signal output impedance of the driving cell, by setting output resistance parameter 320 equal to the large signal output impedance of the cell.

Module 322 receives output resistance parameter 320, multiplies it by first threshold resistance percentage 324 obtained from technology database 312 and compares the multiplicative product to estimated net resistance parameter 313. If estimated net resistance parameter 313 is greater than the multiplicative product of first threshold resistance percentage 324 and output resistance 320, then net 300 is designated for detailed parasitic extraction. In a preferred embodiment of the invention, first threshold resistance percentage 324 equals 30%.

If net 300 is designated for detailed parasitic extraction, module 354 performs the extraction preferably employing a distributed impedance model. For example, this software may execute the STAR-R software from AVANT! CORPORATION to perform the detailed parasitic extraction using a distributed impedance model. The output of module 354, the detailed parasitic net resistance of result 356, is input to module 330 for use in determining a chip level delay of the driver cell of net 300, if net 300 was designated for detailed parasitic extraction.

Module 322 also multiplies output resistance parameter 320 by second threshold resistance percentage 325 obtained from technology database 312 and compares the multiplicative product to estimated resistance parameter 313. In a preferred embodiment of the invention, second threshold resistance percentage 325 equals 10%. If output resistance parameter 320 exceeds the product of the second threshold and does not exceed the product of the first threshold, then the parasitic net resistance of result 352, equaling estimated net resistance 313, is input to module 330 for chip level delay determination. If output resistance parameter 320 does not exceed either the product of the first threshold or the product of the second threshold, then the parasitic net resistance of result 350, equaling zero, is input to module 330 for chip level delay determination.

Likewise, returning to FIG. 3A, total net length parameter 307 is received as input to module 311, which determines an estimated net capacitance of net 300. Module 311 also determines capacitance per unit length value 332 from technology database 312. Capacitance per unit length value 332 may be a constant value. Module 311 determines the estimated net capacitance by multiplying capacitance per unit length value 332 with total net length 307 and outputs estimated net capacitance parameter 334.

In FIG. 3B, module 336 obtains from netlist 316 the load cells of net 300 and obtains from cell library 318 the load capacitances of each load cell. Module 336 also calculates a gate capacitance of net 300, which is the sum of load capacitances of the cells loading net 300. The sum of these load capacitances are output from module 336 as gate capacitance value 338, which is input to module 322.

Module 322 receives gate capacitance value 338, multiplies it by first threshold capacitance percentage 342 obtained from technology database 312, and compares the multiplicative product to estimated net capacitance parameter 334. If estimated net capacitance parameter 334 is greater than the multiplicative product of first threshold capacitance percentage 342 and gate capacitance 338, then net 300 is designated for detailed parasitic extraction. In a preferred embodiment of the invention, threshold capacitance percentage 342 equals 30%.

As with the parasitic resistance portion of the system, module 354 performs detailed parasitic extraction, using a distributed parasitic model, for nets designated for detailed parasitic extraction by module 322. The output of module 354, the detailed parasitic net capacitance of result 356, is input to module 330 for use in determining a chip level delay of the driver cell of net 300, if net 300 was designated for detailed parasitic extraction.

Module 311 also multiplies gate capacitance parameter 338 by second threshold capacitance percentage 343 obtained from technology database 312 and compares the multiplicative product to estimated capacitance parameter 334. In a preferred embodiment of the invention, second threshold resistance percentage 343 equals 10%. If gate capacitance parameter 338 exceeds the product of the second threshold and does not exceed the product of the first threshold, then the parasitic net capacitance of result 352, equaling estimated net capacitance 334, is input to module 330 for chip level delay determination. If estimated net capacitance parameter 334 does not exceed either the product of the first threshold or the product of the second threshold, then the parasitic net capacitance of result 350, equaling zero, is input to module 330 for chip level delay determination.

An embodiment of the invention may be implemented wherein only resistance is analyzed or extracted for the net. Alternatively, and embodiment may analyze or extract capacitance portion of the invention. In a preferred embodiment, both estimated resistance and capacitance are estimated and evaluated for detailed parasitic extraction, and, if a net is designated for detailed parasitic extraction by virtue of the estimated net resistance or the estimated net capacitance, a detailed parasitic extraction is performed on both net resistance and capacitance. Nevertheless, combinations of this designation may be varied such that the parasitic component, either resistance or capacitance, corresponding to a net impedance exceeding the threshold is designated for detailed parasitic extraction while a parasitic component which does not exceed the threshold is not designated for parasitic extraction.

While the method disclosed herein has been described and shown with reference to particular steps performed in a particular order, it will be understood that these steps may be combined, sub-divided, or re-ordered to form an equivalent method without departing from the teachings of the present invention. Accordingly, unless specifically indicated herein, the order and grouping of the steps is not a limitation of the present invention.

The foregoing description of a preferred embodiment of the invention has been presented for purposes of illustration and description. It is not intended to be exhaustive or to limit the invention to the precise form disclosed, and obviously many modifications and variations are possible in light of the above teachings. The embodiment was chosen and described in order to best explain the principles of the invention and its practical application to thereby enable others skilled in the art to best utilize the invention in various embodiments and various modifications as are suited to the particular use contemplated.

What is claimed is:

1. A computer-readable medium that stores a computer executable program for extracting a parasitic impedance parameter associated with a net wherein the computer executable program comprises:

a module for determining net length that receives as inputs a net from a layout database and that generates as outputs a port-to-port net length and a total net length;

a module for estimating net resistance that receives as inputs the port-to-port net length from the module for determining net length and a resistance per unit length from a technology database and that generates as output an estimated net resistance;

a module for determining output resistance that receives as inputs a driving cell from a netlist and a large-signal output impedance of the driving cell from a cell library and that generates as output an output resistance equal to the large-signal output impedance of the driving cell;

a module for determining whether to designate the net for detailed parasitic extraction that receives as inputs the output resistance from the module for determining output resistance, a first threshold resistance percentage from the technology database, a second threshold resistance percentage from the technology database, the estimated net resistance from the module for estimating net resistance, a gate capacitance, an estimated net capacitance, a first threshold capacitance percentage from the technology database, and a second threshold capacitance percentage from the technology database and that performs one of the following:

designates the net for parasitic extraction if the estimated net resistance is greater than the product of the output resistance times the first threshold resistance percentage or if the estimated net capacitance is greater than the product of the gate capacitance times the first threshold capacitance percentage;

generates as output parasitic results equal to the estimated net resistance and the estimated net capacitance if the estimated net resistance is greater than the product of the output resistance times the second threshold resistance percentage or if the estimated net capacitance is greater than the product of the gate capacitance times the second threshold capacitance percentage; and generates as output parasitic results equal to zero if the estimated net resistance is not greater than the product of the output resistance times the second threshold resistance percentage and if the estimated net capacitance is not greater than the product of the gate capacitance times the second threshold capacitance percentage;

a module for performing parasitic extraction coupled to the module for determining whether to designate the net for detailed parasitic extraction that uses a distributed impedance model to generate as output parasitic results;

a module for estimating net capacitance that receives as inputs the total net length from the module for determining net length and a capacitance per unit length from the technology database and that generates as output the estimated net capacitance;

a module for determining gate capacitance that receives as inputs a plurality of load cells from the netlist and load capacitances of the plurality of load cells from the cell library and that calculates the sum of the load capacitances to generate as output the gate capacitance; and a module for determining chip level delay that receives as inputs the parasitic results from the module for performing parasitic extraction and the parasitic results from the module for determining whether to designate the net for detailed parasitic extraction and that generates as output a chip level delay of the driver cell.

* * * * *